United States Patent [19]

Goto

[11] Patent Number: 4,623,804

[45] Date of Patent: Nov. 18, 1986

[54] FLUXOID TYPE SUPERCONDUCTING LOGIC ELEMENT

[75] Inventor: Eiichi Goto, Wako, Japan

[73] Assignee: Rikagaku Kenkyusho, Japan

[21] Appl. No.: 575,523

[22] Filed: Jan. 31, 1984

[30] Foreign Application Priority Data

Feb. 4, 1983 [JP] Japan ................................. 58-17921

[51] Int. Cl.[4] ......................................... H03K 19/195
[52] U.S. Cl. .................................... 307/476; 307/277;
307/306; 365/162
[58] Field of Search ............... 307/306, 462, 476, 277;
357/5; 365/162

[56] References Cited

U.S. PATENT DOCUMENTS 3,953,749 4/1976 Baechtold et al. .................. 307/462
4,176,290 11/1979 Ishida et al. .......................... 307/306

Primary Examiner—John Zazworsky
Attorney, Agent, or Firm—Brumbaugh, Graves, Donohue & Raymond

[57] ABSTRACT

Disclosed is a fluxoid type superconducting logic element essentially comprising a pair of SQUIDs connected with each other so as to put one of said SQUIDs into its "firing state" and the other into its "extinction state" in response to an input signal in the form of magnetic flux, thereby representing a binary digit at its output terminals.

6 Claims, 10 Drawing Figures

FLUXOID TYPE SUPERCONDUCTING LOGIC ELEMENT

BACKGROUND OF THE INVENTION

The present invention relates to a superconducting logic element, and particularly to a superconducting logic element which is capable of performing, on the basis of the quantum effect, various functions as required for instance in an electronic computer. Such logic element is hereinafter referred to as "fluxoid type superconducting logic element". The term, "fluxoid" is an abbreviation for "magnetic flux quantum unit", $\phi_o(=2\times 10^{-7}$ gauss cm$^{-2}$).

The object of this invention is to provide a fluxoid type superconducting logic element using Josephson Junctions, and hence capable of operating at an increased speed.

SUMMARY OF THE INVENTION

To attain this object a fluxoid type superconducting logic element according to this invention comprises a pair of radio frequency superconducting quantum interference devices (hereinafter abbreviated "r-f SQUID") each essentially comprising a superconductor loop including a Josephson Junction; a drive means inductance-coupled with each r-f SQUID for applying a drive magnetic flux thereto; an input means inductance-coupled with each r-f SQUID for supplying thereto an input signal in the form of magnetic flux; and an output means inductance-coupled with each r-f SQUID for providing an output signal in the form of electric current or voltage, said r-f SQUIDs being inductance-coupled with each other so as to put one of the SQUIDs to its "firing" state and the other to its "extinction" state in response to the input signal

DESCRIPTION OF PREFERRED EMBODIMENTS

Figure 1A:
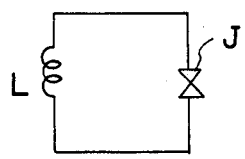
FIG. 1A is a schematic illustration of a superconductor loop including a Josephson Junction used in the logic element of the invention.
Figure 1B:
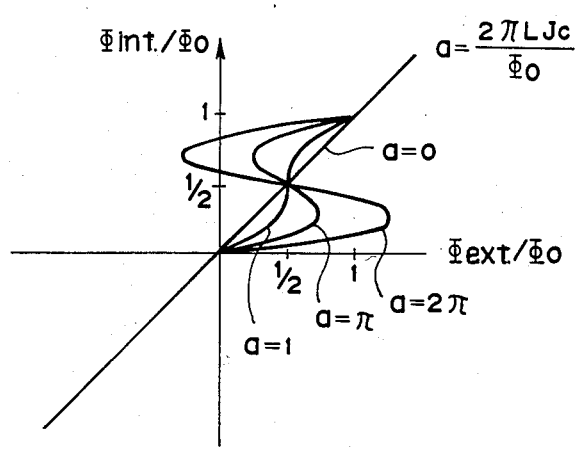
FIG. 1B is a graphical representation showing the internal to external magnetic field characteristics of the device schematically illustrated in FIG. 1A.
Figure 1C:
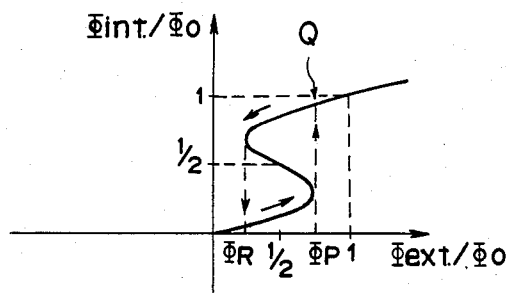
FIG. 1C is another schematic view showing the internal to external magnetic flux characteristics of the device of FIG. 1A under particular conditions.
Figure 1D:
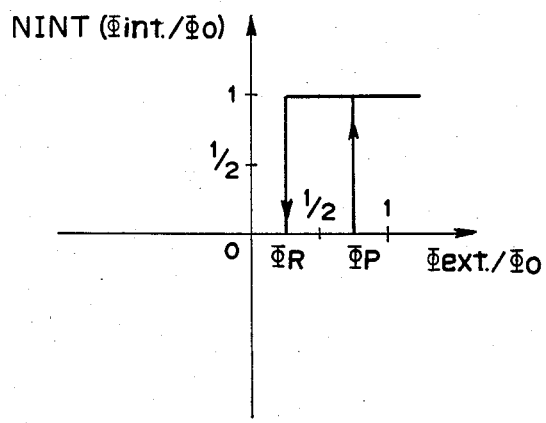
FIG. 1D is a symbolic graphical representation of the relation between the internal and external magnetic flux values during operation of the device of FIG. 1A.

FIG. 1A shows an r-f SQUID whereas FIG. 1B shows the internal-to-external magnetic flux characteristics of the r-f SQUID. The r-f SQUID is shown as comprising a superconductor loop including a Josephson Junction J and an inductance L. In operation, when an external magnetic flux $\phi_{ext}$ is applied to the loop, a persistent current I will flow in the loop to generate a counter magnetic flux (=L I) as much as the external magnetic flux. The persistent current I, and hence the counter magnetic flux will increase with the increase of the external magnetic flux until the persistent current reaches its critical value Jc, thus maintaining the inside of the loop magnetically quiescent. When the persistent current increases beyond its critical value the superconducting state of the loop will turn to the normal state at the weak link of the Josephson Junction, thereby allowing magnetic flux as strong as the magnetic flux quantum unit $\phi_o$ to enter the loop, which magnetic flux being referred to as "internal magnetic flux". The internal-to-external magnetic flux characteristics are shown for a $(=2\pi L\cdot Jc/\phi_o)\leq 1$ and for a>1 in FIG. 1B. FIG. 1C shows the internal-to-external magnetic flux characteristics of an r-f SQUID for a=$\pi$. As shown, when the external magnetic flux $\phi_{ext}$ reaches the upper critical value $\phi_p$, the internal magnetic flux $\phi_{int}$ will appear as indicated at Q, and when the external magnetic flux $\phi_{ext}$ reaches the lower critical value $\phi_R$, the internal magnetic flux $\phi_{int}$ will almost disappear. This rise-and-fall variation is symbolically represented in FIG. 1D. The state corresponding to NINT ($\phi_{int}/\phi_o$)=1 in the hysteresis looP is herein called "firing state" whereas the state corresponding to NINT ($\phi_{int}/\phi_o$)=0 is called "extinction state".

Figure 2:
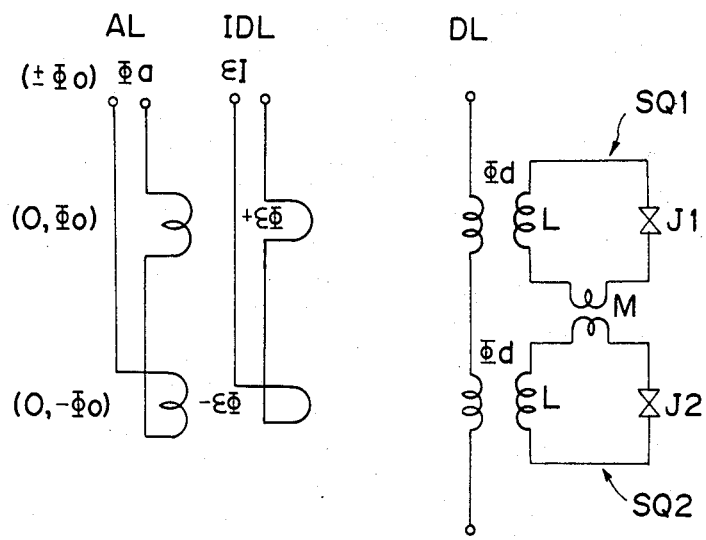
FIG. 2 is a schematic diagram illustrating the structure of a representative fluxoid type superconducting logic element according the invention.

FIG. 2 shows schematically the structure of a fluxoid type superconducting logic element according to this invention. It is shown as essentially comprising a pair of r-f SQUIDs SQ1 and SQ2 including Josephson Junctions J1 and J2 respectively. These r-f SQUIDs are inductance-coupled with each other so as to put one of the SQUIDs in its "firing state" and put the other in its "extinction state" in response to an input signal in the form of magnetic flux. As shown an inductance means DL is provided to apply a drive of external magnetic flux $\phi_d$ to each SQUID. The SQUIDs SQ1 and SQ2 are magnetically coupled with each other by a mutual inductance M with such a coupling polarity that development of one of the SQUIDs into its "firing state" may drive the other SQUID into its "extinction state". The strength of the drive magnetic flux is just below the upper critical value $\phi_p$, and when a very small input magnetic flux $\epsilon\phi$ is applied to one of the SQUIDs in addition to the drive magnetic flux, the SQUID will be put in its "firing state", and as a counter action, the other SQUID will be put in its "extinction state". For the purpose of applying an input magnetic flux to the SQUIDs a superconducting inductance means IDL is used to carry an input current $\epsilon I$ thereby generating and applying input magnetic fluxes of opposite polarities to the SQUIDs SQ1 and SQ2 respectively to assure of the positive appearance of the opposite states in the two SQUIDs. It, however, should be noted that it suffices that a single superconducting inductance means is provided to magnetically couple with one of the SQUIDs. For the purpose of providing an output signal another superconducting inductance means AL is used to magnetically couple with the SQUIDs to detect the appearance of the "firing state" in one of the SQUIDs. In short, a fluxoid type superconducting logic element might be said to be a fluxoid type binary amplifier which is designed to be magnetically energized and to be responsive to a very small amount of input magnetic flux $\epsilon\phi$ for providing an amplified amount of output magnetic flux $\pm\phi$.

Figure 3:
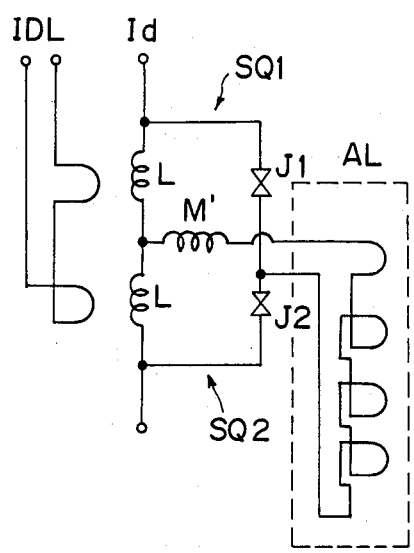
FIG. 3 is a schematic diagram illustrating a modified form of superconducting logic element according to the invention.

FIG. 3 shows a modification of the embodiment of FIG. 2. As shown, it is constructed so as to apply an external magnetic flux to each SQUID by supplying a dc electric current Id to the inductance L of each SQUID. Also, it includes an inductance M' and an associated output circuit AL in which electric currents from SQ1 and SQ2 flow, so as to put one of the SQUIDs in its "firing state" and the other in its "extinction state" in response to an input signal from IDL, thus attaining the same result as in FIG. 2.

Figure 4:
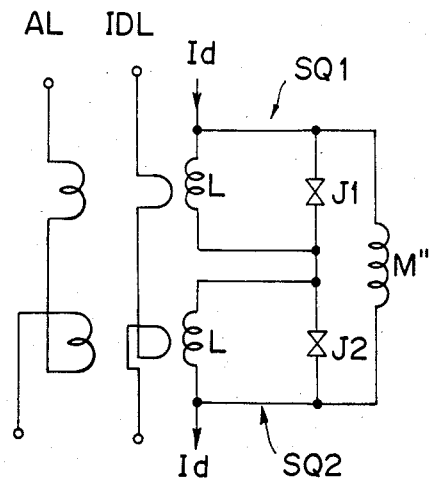
FIG. 4 is a schematic diagram illustrating another embodiment of the invention.

FIG. 4 shows another modification of the embodiment of FIG. 2. As shown, it has the same configuration as FIG. 2 in applying an external magnetic flux to each SQUID. However, an inductance M" is used to couple the two SQUIDs with each other. In operation the logic element of FIG. 4 responds to an input magnetic flux from IDL for putting one of the SQUIDs to its "firing state" and the other to its "extinction state".

Figure 5:
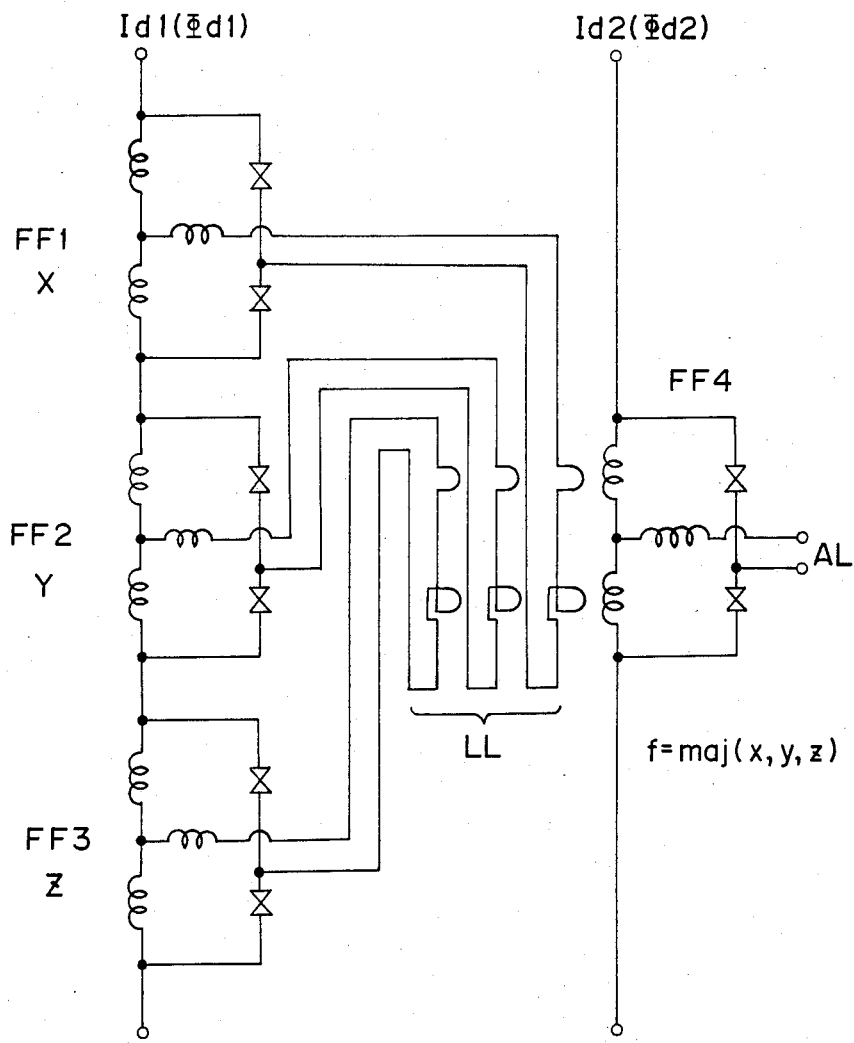
FIG. 5 is a schematic diagram illustrating a logic circuit composed of a plurality of logic elements in accordance with the invention.

FIG. 5 shows a threshold logic circuit, specifically a three-input majority logic circuit, f=maj (x, y, z), composed of a plurality of logic elements FF1–FF4 according to the embodiment of FIG. 3. Three logic elements FF1–FF3 are coupled to a logic element FF4 as indicated at LL. Assume that a drive current Id1 flows to apply an external magnetic flux to each of the logic elements FF1, FF2 ad FF3 and that these logic elements represent different binary variables x, y and z respectively. Then, a drive current Id2 is supplied to the logic element FF4 to represent the majority logic result at its output terminal AL.

A "NOT" circuit can be easily constructed simply by reversing the polarity of either of the primary or secondary windings of a superconducting flux transformer for applying an input magnetic flux to a logic element. The superconducting flux transformer may be used as an input inductance means IDL, and therefore no extra circuit element is required for constructing a "NOT" circuit.

Figure 6:
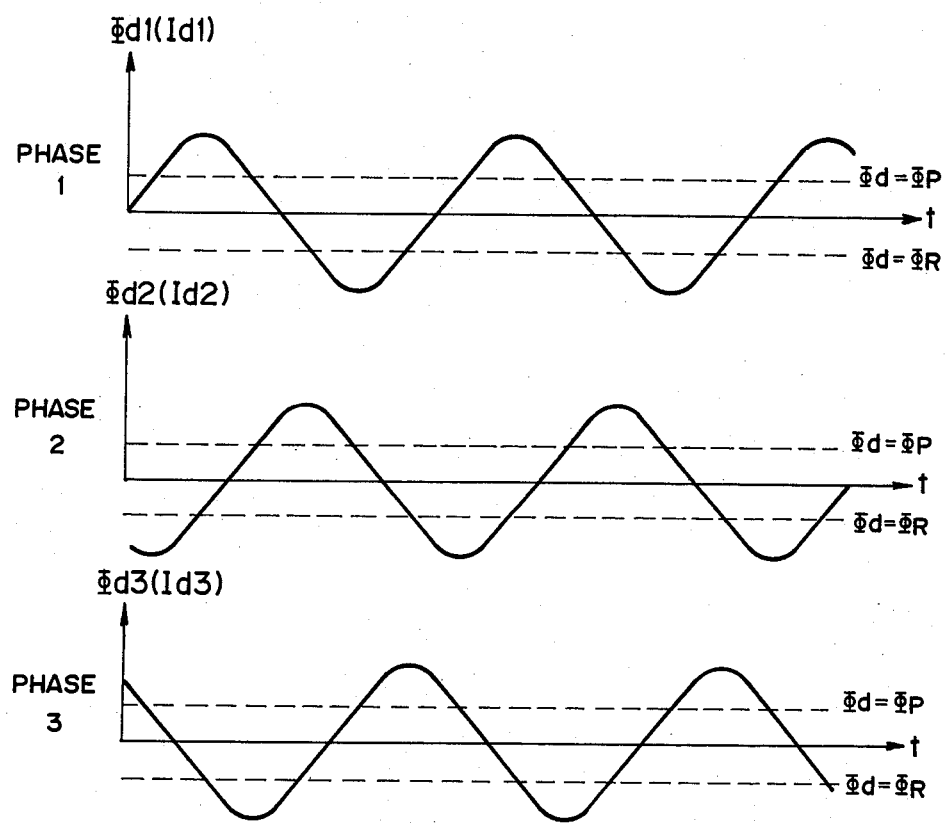
FIG. 6 is a graphical representation showing the relationship between clock signals used in connection with the embodiment of FIG. 5.

A magnetically coupled configuration of logic elements as shown in FIG. 5 has no directionality in conveying pieces of information. To assure that pieces of information are conveyed in a predetermined direction three or more phase clock signal generator may be used to supply drive magnetic fluxes (on electric currents), as is the case with a parametron. FIG. 6 shows the waveforms of such three-phase clock signal. Phase 1 shows a drive magnetic flux (or current) $\Phi d1$ (Id1) to be applied to FF1 FF2 and FF3; phase 2 shows a drive magnetic flux (or current) $\Phi d2$ (Id2) to be applied to FF4; and phase 3 shows a drive magnetic flux (or current) $\Phi d3$ (Id3) to be applied to a subsequent circuit (not shown). As shown, every waveform varies sinusoidally with its maximum above the external upper threshold magnetic flux and its minimum below the external lower threshold magnetic flux. When the majority logic circuit of FIG. 5 is controlled with the clock signal of FIG. 6, a group of logic elements FF1 to FF3 and the final logic element FF4 will be put in standby in the order named, but will never be put in standby in the opposite way, thus assuring of unidirectional transmission. As an actual example fluxoid type superconducting logic elements including "weak link" or bridge type Josephson Junctions made of a superconducting niobium were used at "a"=$\pi$, and then their switching time was below 1 picosecond ($10^{-12}$ seconds). Therefore, these logic elements can operate with clock signal of ten or more gigahertz. Clock signals other than sinusoidal waves are difficult to use. In FIG. 6 each clock signal is formed by superposing a sinusoidal wave on a d c bias corresponding to the intermediate value between $\Phi P$ and $\Phi R$.

Figure 7:
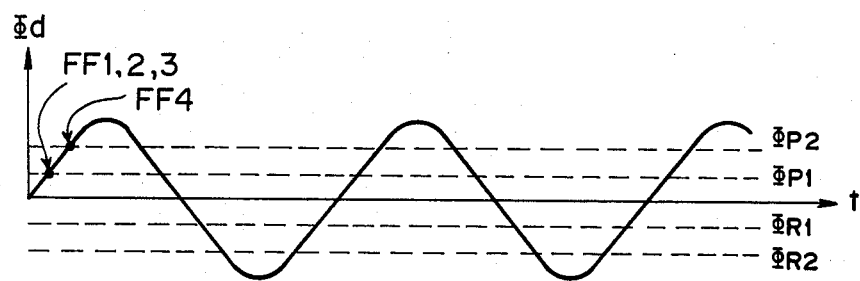
FIG. 7 is a graphical representation illustrating another clock signal wave form arrangement.

FIG. 7 shows another clock signal waveform which, if applied to the majority logic circuit of FIG. 5, can assure that pieces of information are conveyed in a predetermined direction. Assume that the logic elements FF1, FF2 and FF3 have same upper and lower threshold fluxes $\Phi P1$ and $\Phi R1$ and that the logic element FF4 has upper and lower threshold fluxes $\Phi P2$ and $\Phi R2$, the absolute values of which are larger than $\Phi P1$ and $\Phi R1$ respectively. The clock flux $\Phi d$ is shown as varying sinusoidally with its maximum above $\Phi P2$ and its minimum below $\Phi R2$ in FIG. 7. As is apparent from the drawing, the majority logic circuit of FIG. 5 is controlled with the clock flux $\Phi d$, the logic elements FF1, FF2 and FF3 are assured to establish their binary states before the logic element FF4, as indicated at FF1, 2, 3 and FF4.

As for the amplitude of the sinusoidal clock signals of FIGS. 6 and 7, the maximum of the sinusoidal wave must be determined so as to be above the upper threshold value $\Phi P$ of the external magnetic flux but below a certain upper limit, for instance, 7/3 times as much as the upper threshold value $\Phi P$ for a=$\pi$. The allowance of amplitude is advantageously great, and this is attributable to the differential combination of two SQUIDs according to this invention.

Niobium may be preferably used in producing a fluxoid type superconducting logic element according to this invention, and a configuration of inductances and Josephson Junctions as required can be easily formed, for instance, according to the lithography or sputtering technique.

As for the energy required for driving a single logic element according to this invention, assume that the device has an inductance L of 10pH. (this much inductance can be easily produced by the photolithography technique in the form of a single circular loop about 10 $\mu$m across or of a single square about 10 $\mu$m side.) Then, the required energy E is given by:

$$E=\phi_o^2/2L=2\times10^{-19} \text{ joules}$$

If this logic element is driven by clock signal of 10GHz, the required energy is equal to $2\times10^{-9}$ watts. This figure is very small compared with the energy ($2\times10^{-6}$ watts) required for a conventional dc SQUID circuit capable of representing a binary digit in the form of voltage state.

One tenth of reduction of the logic element in size will multiply the required energy ten times. This is because the inductance of the reduced logic element decreases ten times as a result of physical size reduction. The required energy, however, can be reduced $N^2$ times by increasing the number of turns N times. Thus, the required energy can be reduced to a desired value.

What is claimed is:

1. A flux-driven type superconducting logic element comprising:

a pair of magnetically connected radio frequency superconducting quantum interference devices, each device comprising a superconducting loop including an unshunted Josephson junction and inductance means, each device having a hysteresis pattern in its external-to-internal magnetic flux response characteristics and having substantially the same external upper magnetic flux threshold value above which threshold value an increase in external magnetic flux produces a step-wise increase in internal magnetic flux;

drive inductance means for applying a drive magnetic flux to each device, said drive magnetic flux being lower than the external upper magnetic flux threshold, such that in the absence of additional external magnetic flux being applied to said devices, the Josephson junctions therein are all operatively maintained in the superconducting state;

coupling inductance means for coupling the pair of device with each other so that a step-wise increase of internal magnetic flux in one of the devices suppresses any step-wise increase of internal magnetic flux in the other device;

input inductance means for applying a relatively small amount of input magnetic flux to said devices in a differential way so that the strength of the external magnetic flux in one of said devices increases above its upper threshold value to cause the step-wise increase in the internal magnetic flux therein while supressing any step-wise increase in internal magnetic flux in the other of said devices; and output inductance means providing an output magnetic flux resulting from the difference between the internal magnetic fluxes in said devices.

2. A flux-driven type superconducting logic element according to claim 1 wherein each device has an external lower magnetic flux threshold value below which a step-wise decrease in internal magnetic flux is caused so as to reset the device to its original state and further comprising means for reducing the drive magnetic flux below the external lower threshold magnetic flux value of the devices.

3. A logic circuit comprising a plurality of connected groups each containing at least one flux-driven type superconducting logic element according to claim 1, the logic elements belonging to a same group having the same external upper magnetic flux threshold value, and the logic elements of a preceding group having an external upper magnetic flux threshold value lower than that of the logic elements of a subsequent group, and drive means for supplying to all of the logic groups a drive magnetic flux which varies with time so as to assure unidirectional transmission of signals from the preceding to the subsequent group.

4. A logic circuit comprising a plurality of flux-driven type superconducting logic elements according to claim 1 which are cascade-connected with each other by an inductance coupling between a preceding pair of devices and a subsequent pair of devices.

5. A logic circuit comprising two or more groups each containing at least one flux-driven type superconnecting logic element according to claim 1, the logic elements of a preceding group being adapted to be driven by a forward-shifted drive meagnetic flux and the logic elements of a subsequent group being adapted to be driven by a backward-shifted drive magnetic flux.

6. A flux-driven type superconducting logic element according to claim 1 wherein the inductance of each device includes a number of turns, thereby reducing the energy of the input magnetic flux required to cause the step-wise increase in the internal magnetic flux in the one of said pair of devices by an amount equal to the square of the number of turns compared with that which would be required if the inductance were formed by a single turn.

* * * * *